(12) United States Patent
Griffin

(10) Patent No.: US 6,791,412 B2
(45) Date of Patent: Sep. 14, 2004

(54) DIFFERENTIAL AMPLIFIER OUTPUT STAGE

(75) Inventor: Jed D. Griffin, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 493 days.

(21) Appl. No.: 09/749,661

(22) Filed: Dec. 28, 2000

(65) Prior Publication Data

US 2002/0084848 A1 Jul. 4, 2002

(51) Int. Cl.[7] .................................................. H03F 3/45
(52) U.S. Cl. ........................ 330/253; 330/255; 330/258
(58) Field of Search ................................ 330/253, 255, 330/258, 261, 311

(56) References Cited

U.S. PATENT DOCUMENTS

| | | | |
|---|---|---|---|
| 3,991,380 A | * 11/1976 | Pryor | 330/253 |
| 4,377,789 A | * 3/1983 | Hoover | 330/253 |
| 5,485,579 A | 1/1996 | Hitz et al. | 395/200.12 |
| 5,495,419 A | 2/1996 | Rostoker et al. | 364/468 |
| 5,535,116 A | 7/1996 | Gupta et al. | 364/134 |
| 5,541,914 A | 7/1996 | Krishnamoorthy et al. | 370/56 |
| 5,551,048 A | 8/1996 | Steely, Jr. | 395/800 |
| 5,557,533 A | 9/1996 | Koford et al. | 364/491 |
| 5,581,729 A | 12/1996 | Nishtala et al. | 395/470 |
| 5,588,131 A | 12/1996 | Borrill | 395/473 |
| 5,588,132 A | 12/1996 | Cardoza | 395/475 |
| 5,588,152 A | 12/1996 | Dapp et al. | 395/800 |
| 5,590,292 A | 12/1996 | Wooten et al. | 395/825 |
| 5,590,345 A | 12/1996 | Barker et al. | 395/800 |
| 5,594,918 A | 1/1997 | Knowles et al. | 395/800 |
| 5,603,005 A | 2/1997 | Bauman et al. | 395/451 |
| 5,613,136 A | 3/1997 | Casavant et al. | 395/800 |
| 5,617,537 A | 4/1997 | Yamada et al. | 395/200.01 |
| 5,625,836 A | 4/1997 | Barker et al. | 395/800 |
| 5,634,004 A | 5/1997 | Gopinath et al. | 395/200.02 |
| 5,634,068 A | 5/1997 | Nishtala et al. | 395/800 |
| 5,636,125 A | 6/1997 | Rostoker et al. | 364/468.28 |
| 5,644,753 A | 7/1997 | Ebrahim et al. | 395/458 |
| 5,655,100 A | 8/1997 | Ebrahim et al. | 395/471 |
| 5,657,472 A | 8/1997 | Van Loo et al. | 395/485 |
| 5,678,026 A | 10/1997 | Vartti et al. | 395/479 |
| 5,680,571 A | 10/1997 | Bauman | 395/449 |
| 5,680,576 A | 10/1997 | Laudon | 395/472 |
| 5,682,322 A | 10/1997 | Boyle et al. | 364/491 |
| 5,682,512 A | 10/1997 | Tetrick | 395/412 |
| 5,684,977 A | 11/1997 | Van Loo et al. | 395/470 |
| 5,699,500 A | 12/1997 | Dasgupta | 395/180 |
| 5,701,313 A | 12/1997 | Purdham | 371/40.2 |
| 5,701,413 A | 12/1997 | Zulian et al. | 395/200.02 |
| 5,703,532 A | * 12/1997 | Shin et al. | 330/253 |
| 5,708,836 A | 1/1998 | Wilkinson et al. | 395/800 |
| 5,710,935 A | 1/1998 | Barker et al. | 395/800 |
| 5,713,037 A | 1/1998 | Wilkinson et al. | 395/800 |
| 5,717,942 A | 2/1998 | Haupt et al. | 395/800 |
| 5,717,943 A | 2/1998 | Barker et al. | 395/800 |
| 5,717,944 A | 2/1998 | Wilkinson et al. | 395/800 |
| 5,734,921 A | 3/1998 | Dapp et al. | 395/800.1 |
| 5,734,922 A | 3/1998 | Hagersten et al. | 395/800.37 |
| 5,742,510 A | 4/1998 | Rostoker et al. | 364/468.03 |
| 5,745,363 A | 4/1998 | Rostoker et al. | 364/468.28 |
| 5,749,095 A | 5/1998 | Hagersten | 711/141 |
| 5,752,067 A | 5/1998 | Wilkinson et al. | 395/800.16 |
| 5,754,789 A | 5/1998 | Nowatzyk et al. | 395/200.63 |
| 5,754,871 A | 5/1998 | Wilkinson et al. | 395/800 |
| 5,754,877 A | 5/1998 | Hagersten et al. | 395/800.29 |
| 5,761,523 A | 6/1998 | Wilkinson et al. | 395/800.2 |
| 5,765,011 A | 6/1998 | Wilkinson et al. | 395/800.2 |

(List continued on next page.)

Primary Examiner—Patricia Nguyen
(74) Attorney, Agent, or Firm—Kenyon & Kenyon

(57) ABSTRACT

An output stage for a differential amplifier is presented. If the differential amplifier is a matched current differential amplifier where the non-inverted and inverted differentials have the same current, the output stages of the present invention may provide optimum gain to the differentials in a single output voltage.

12 Claims, 5 Drawing Sheets

U.S. PATENT DOCUMENTS

| | | |
|---|---|---|
| 5,781,439 A | 7/1998 | Rostoker et al. ........ 364/468.28 |
| 5,784,697 A | 7/1998 | Funk et al. .................. 711/170 |
| 5,787,094 A | 7/1998 | Cecchi et al. .................. 371/53 |
| 5,793,644 A | 8/1998 | Koford et al. ............... 364/491 |
| 5,794,059 A | 8/1998 | Barker et al. ............. 395/800.1 |
| 5,796,605 A | 8/1998 | Hagersten .................... 365/134 |
| 5,802,578 A | 9/1998 | Lovett ......................... 711/147 |
| 5,805,839 A | 9/1998 | Singhal ....................... 395/292 |
| 5,815,403 A | 9/1998 | Jones et al. .................. 364/489 |
| 5,842,031 A | 11/1998 | Barker et al. ............... 395/800 |
| 5,848,254 A | 12/1998 | Hagersten .................... 395/383 |
| 5,857,113 A | 1/1999 | Muegge et al. ............. 395/830 |
| 5,860,159 A | 1/1999 | Hagersten .................... 711/151 |
| 5,862,316 A | 1/1999 | Hagersten et al. ..... 395/182.13 |
| 5,864,738 A | 1/1999 | Kessler et al. .......... 395/200.69 |
| 5,867,649 A | 2/1999 | Larson .................... 395/200.31 |
| 5,870,313 A | 2/1999 | Boyle et al. .................. 364/491 |
| 5,870,619 A | 2/1999 | Wilkinson et al. ........ 395/800.2 |
| 5,875,117 A | 2/1999 | Jones et al. .................. 364/491 |
| 5,875,201 A | 2/1999 | Bauman et al. ............. 371/49.1 |
| 5,875,462 A | 2/1999 | Bauman et al. ............. 711/119 |
| 5,875,472 A | 2/1999 | Bauman et al. ............. 711/150 |
| 5,878,241 A | 3/1999 | Wilkinson et al. .......... 395/379 |
| 5,878,268 A | 3/1999 | Hagersten .............. 395/800.28 |
| 5,881,303 A | 3/1999 | Hagersten et al. ....... 395/800.3 |
| 5,887,138 A | 3/1999 | Hagersten et al. ..... 395/200.45 |
| 5,887,146 A | 3/1999 | Baxter et al. ................ 395/284 |
| 5,892,970 A | 4/1999 | Hagersten .................... 395/825 |
| 5,897,657 A | 4/1999 | Hagersten et al. .......... 711/145 |
| 5,900,020 A | 5/1999 | Safranek et al. ............. 711/167 |
| 5,903,461 A | 5/1999 | Rostoker et al. ........ 364/468.28 |
| 5,905,881 A | 5/1999 | Tran et al. ................... 395/395 |
| 5,905,998 A | 5/1999 | Ebrahim et al. ............. 711/144 |
| 5,911,052 A | 6/1999 | Singhal et al. ............... 395/293 |
| 5,914,887 A | 6/1999 | Scepanovic et al. ........ 364/491 |
| 5,922,063 A | 7/1999 | Olnowich et al. ........... 710/132 |
| 5,925,097 A | 7/1999 | Gopinath et al. ............ 709/200 |
| 5,931,938 A | 8/1999 | Drogichen et al. ........... 712/15 |
| 5,938,765 A | 8/1999 | Dove et al. ..................... 713/1 |
| 5,941,967 A | 8/1999 | Zulian ......................... 710/107 |
| 5,943,150 A | 8/1999 | Deri et al. .................... 359/133 |
| 5,946,710 A | 8/1999 | Bauman et al. ............. 711/129 |
| 5,950,226 A | 9/1999 | Hagersten et al. .......... 711/124 |
| 5,958,019 A | 9/1999 | Hagersten et al. .......... 709/400 |
| 5,960,455 A | 9/1999 | Bauman ...................... 711/120 |
| 5,961,623 A | 10/1999 | James et al. ................. 710/113 |
| 5,963,745 A | 10/1999 | Collins et al. .......... 395/800.13 |
| 5,963,746 A | 10/1999 | Barker et al. ............ 395/800.2 |
| 5,963,975 A | 10/1999 | Boyle et al. ................. 711/147 |
| 5,964,886 A | 10/1999 | Slaughter et al. ............... 714/4 |
| 5,966,528 A | 10/1999 | Wilkinson et al. .......... 395/563 |
| 5,971,923 A | 10/1999 | Finger ......................... 600/437 |
| 5,978,578 A | 11/1999 | Azarya et al. ............... 395/701 |
| 5,978,874 A | 11/1999 | Singhal et al. .............. 710/107 |
| 5,983,326 A | 11/1999 | Hagersten et al. .......... 711/147 |
| 5,999,734 A | 12/1999 | Willis et al. ................. 395/706 |
| 6,026,461 A | 2/2000 | Baxter et al. ................ 710/244 |
| 6,038,646 A | 3/2000 | Sproull ........................ 711/158 |
| 6,038,651 A | 3/2000 | VanHuben et al. ............ 712/21 |
| 6,041,376 A | 3/2000 | Gilbert et al. ............... 710/108 |
| 6,049,845 A | 4/2000 | Bauman et al. ............. 710/113 |
| 6,049,853 A | 4/2000 | Kingsbury et al. .......... 711/147 |
| 6,052,760 A | 4/2000 | Bauman et al. ............. 711/119 |
| 6,055,617 A | 4/2000 | Kingsbury ................... 711/203 |
| 6,065,037 A | 5/2000 | Hitz et al. .................... 709/200 |
| 6,065,077 A | 5/2000 | Fu ............................... 710/100 |
| 6,081,844 A | 6/2000 | Nowatzyk et al. ........... 709/233 |
| 6,085,295 A | 7/2000 | Ekanadham et al. ........ 711/145 |
| 6,092,136 A | 7/2000 | Luedtke ....................... 710/107 |
| 6,092,156 A | 7/2000 | Schibinger et al. .......... 711/145 |
| 6,094,715 A | 7/2000 | Wilkinson et al. ............ 712/20 |
| 6,108,739 A | 8/2000 | James et al. ................. 710/113 |
| 6,119,215 A | 9/2000 | Key et al. ...................... 712/19 |
| 6,141,733 A | 10/2000 | Arimilli et al. .............. 711/141 |
| 6,148,361 A | 11/2000 | Carpenter et al. ........... 710/260 |
| 6,155,725 A | 12/2000 | Scepanovic et al. ...... 395/500.1 |
| 6,161,191 A | 12/2000 | Slaughter et al. ............... 714/4 |
| 6,167,489 A | 12/2000 | Bauman et al. ............. 711/145 |
| 6,171,244 B1 | 1/2001 | Finger et al. ................ 600/437 |
| 6,173,386 B1 | 1/2001 | Key et al. ...................... 712/10 |
| 6,173,413 B1 | 1/2001 | Slaughter et al. ............... 714/6 |
| 6,182,112 B1 | 1/2001 | Malek et al. ................. 709/201 |
| 6,189,078 B1 | 2/2001 | Bauman et al. ............. 711/156 |
| 6,189,111 B1 | 2/2001 | Alexander et al. .............. 714/8 |
| 6,199,135 B1 | 3/2001 | Maahs et al. ................ 710/129 |
| 6,199,144 B1 | 3/2001 | Arora et al. ................. 711/145 |
| 6,205,528 B1 | 3/2001 | Kingsbury et al. .......... 711/170 |
| 6,209,064 B1 | 3/2001 | Weber ......................... 711/141 |
| 6,212,610 B1 | 4/2001 | Weber et al. ................ 711/164 |
| 6,226,714 B1 | 5/2001 | Safranek et al. ............. 711/119 |
| 6,429,735 B1 * | 8/2002 | Kuo et al. .................... 327/563 |

* cited by examiner

US 6,791,412 B2

DIFFERENTIAL AMPLIFIER OUTPUT STAGE

BACKGROUND OF THE INVENTION

The present invention pertains to differential amplifiers. More particularly, the present invention pertains to an improved output circuit stage for a differential amplifier.

Differential amplifiers are used to amplify differential inputs, usually small signal differentials, at any given common mode of operation. Superior performance can be achieved by the differential amplifier which exhibits higher amplification that remains consistent, constant, across a wide common mode range. Typical differential amplifiers are specified as having a Common Mode input Range (CMR) in which a given differential gain is available. Also, typical differential amplifiers are specified with a Common Mode Rejection Ratio (CMRR) which denotes the inconsistent behavior of traditional differential amplifiers at different common modes. The CMRR typically represents a differential gain (as a function of common mode) divided by the common mode gain (which varies at different common modes). To compensate for the deficiencies of limited CMR and inconsistent CMRR across the CMR, many differential amplifiers in analog and mixed-mode chips require higher voltages and inefficient increases in power to meet an adequate range of common modes for acceptable behavior. Despite an immense amount of previous efforts, traditional designs have been notoriously far from ideal, always hampered by the paradoxical bias current inherent in differential pair configurations.

Conventional differential amplifiers use a bias current through a differential transistor pair. In metal oxide semiconductor (MOS) circuits, the differential pair features matched devices with resistive loading at their drains. Increased bias current yields greater differential gain as well as greater common mode gain. Thus, changing the bias current is not a solution to the problem of optimizing the CMRR. This inefficient use of power can be intuitively noted by observing that the lower the bias current the better the differential pair operates, keeping the differential pair transistors in their saturation region and keeping their common source far from a virtual ground that would negate the differential pair configuration. Yet the higher the voltage at their common source, due to the lower bias current, the less the differential gain available from the differential pair. The CMR is constrained by the fact that as the common modes approach the voltage at the common source of the differential pair both transistors in the differential pair will enter into their cutoff region and cease to operate. This is perhaps the most serious limitation of traditional designs, which typically use differential pair configurations.

Prior differential amplifiers also have a few other limitations. Coupling a differential amplifier to a high gain stage, for instance, typically requires level shifting, thus limiting the high gain of that stage. Also the slew rate (SR) is adversely dependent upon the CMRR. That is, when the bias current is kept low for a high CMRR, the SR is decreased.

In view of the above, there is a need for an improved differential amplifier circuit.

DETAILED DESCRIPTION

Figure 1:
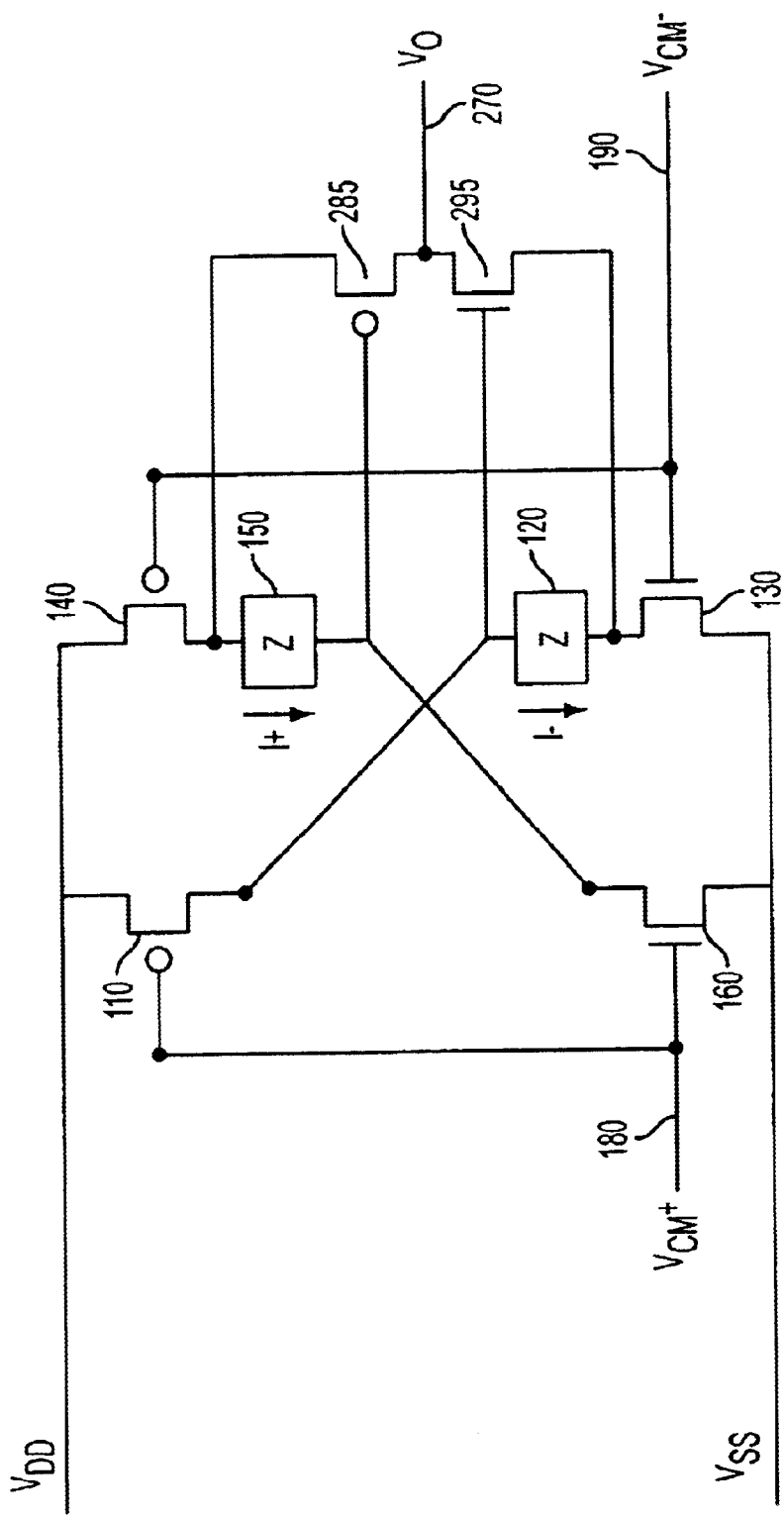
FIG. 1 is a circuit diagram of a matched current differential amplifier.

Referring to FIG. 1, a matched current differential amplifier is shown. As can be seen in the circuit 200, there are two matched differential paths comprised of two differential sets (transistors 110, 140, and transistors 130, 160) each having two input paths and two output paths. The first differential set (transistors 110 and 140) is referenced to a first supply node, VDD. The second differential set (transistors 130 and 160) is referenced to a second supply node, VSS. A first load element 120 is coupled between transistor 110 and transistor 130. A second load element 150 is coupled between transistor 140 and transistor 160. Differential input nodes are labeled 180 and 190. Where common input node 180 (VCM+) is the non-inverting differential input node, and common input node 190 (VCM−) is the inverting differential input node.

Additionally, as illustrated in FIG. 1, a simple output stage may be coupled to the circuit 200. The output stage has a gain output node 270 coupled across the two load elements (load element 120 and load element 150). The matched current differential amplifier coupled to an output stage illustrated by the circuit 200 in FIG. 1 comprises p-channel metal oxide semiconductor field effect transistors (p-MOSFETs) 110 and 140 in the matched current differential amplifier, and transistor 285 in the gain stage. The matched current differential amplifier also is comprised of n-channel metal oxide semiconductor field effect transistors (n-MOSFETs) 130 and 160 in the matched current differential amplifier, and transistor 295 in the gain stage. The load elements 120 and 150 can be comprised of, but not limited to, transistors (for active resistors) or passive resistors.

If the betas of transistors 110, 130, 140 and 160, are matched to each other, and both the inverting differential input node 190 and the non-inverting differential node 180 are connected to the same voltage (a common mode between supply voltages VDD and VSS), then the current through load element 150 will be the same as that of the current through load element 120. Assuming the betas of transistors 285 and 295 are matched, then the current through transistor 285 will match the current through transistor 295. The voltage at the output node 270 will be midway between the supply voltages, requiring no level-shifting and thus optimizing the gain at the next stage.

When the non-inverting differential input node 180 ($V_{CM+}$) increases to a higher voltage than that of the fixed common mode voltage at the inverting differential input node 190 ($V_{CM−}$), the current I+ through load element 150 increases and the current I− through load element 120 decreases. The current through transistor 285 then mirrors the increased current I+. Correspondingly, the current through transistor 295 then mirrors the decreased current of I−. This results in a higher voltage at the gain output node 270 ($V_O$). It follows that the voltage at $V_O$ 270 decreases upon the non-inverting differential input 180 ($V_{CM+}$) decreasing below the inverting differential input node that is still fixed at a common mode. Therefore, by fixing the non-inverting input 180 ($V_{CM+}$) to a common mode, $V_O$ 270 increases as $V_{CM−}$ 190 decreases, and $V_O$ 270 decreases as $V_{CM-}$ 190 increases. Since the gain output $V_O$ 270 is equally determined from current path I+ and I−, any common mode gain in the current paths I+ and I− essentially cancels.

Figure 2:
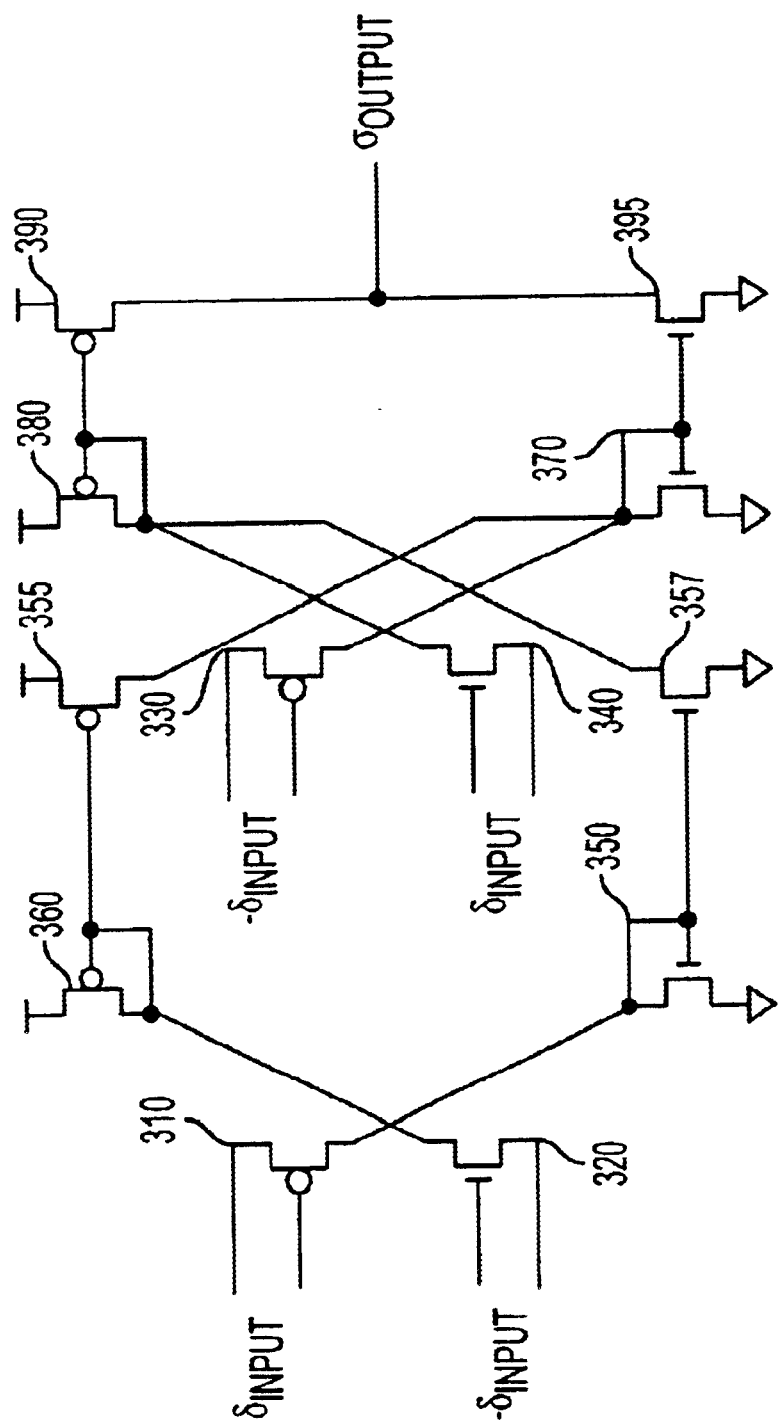
FIG. 2 is a circuit diagram of an output stage for a matched current differential amplifier according to an embodiment of the present invention.

Referring to FIG. 2, an output stage constructed according to an embodiment of the present invention is shown. This output stage may be used to replace the output stage of FIG. 1 (i.e., transistors 285 and 295) and provides both a higher gain and wider output swings. Referring back to FIG. 1, two output voltages are used as input voltages in the circuit of FIG. 2. The first, $\delta_{input}$, appears across load element 150. The second, $-\delta_{input}$, appears across load element 120. In FIG. 2, the $\delta_{input}$ voltage appears at input transistors 310 and 340 while the $-\delta_{input}$ voltage appears at input transistors 320 and 330.

The input transistor 310, 320, 330, and 340 are, in turn, coupled to load transistors 350, 360, 370, and 380. The intermediary transistors 355 and 357 amplify the input through 310 and 320 to match the polarity of the input amplified through 330 and 340. The input transistors amplify the $\delta_{input}$ and $-\delta_{input}$ voltages. The load transistors may be large-signal biased by the supply voltage at the common drains. For example, load transistors 370 and 380 have the same voltage supplied to their common drains. The voltage at the common drains also large-signal biases output transistors 390 and 395. An equal voltage also large-signal biases intermediary transistors 355 and 357. The load and intermediary transistors provide gain to the $\delta_{input}$ voltage signal. Amplification may alternately be observed by viewing the output stages as current mirrors, mirroring and amplifying the difference in currents from the input stage corresponding to the opposite voltages from the input stage.

In operation, differential voltage signals, $\delta_{input}$ and $-\delta_{input}$, are supplied to the input transistors 310 and 320. Depending on the polarity of these signals, one of the transistors is turned on while the other is turned off. They are large-signal biased by the common mode current of the input stage, in the case of matched differential amplifiers the common mode current being approximately equal across all common modes. When the input stage level shifts to midway between the supply voltages, as in matched current configurations, then all transistors in the output stages can be large-signal biased for optimum gain. For example, as $\delta_{input}$ becomes positive and $-\delta_{input}$ becomes negative, transistor 310 is turned on (i.e., amplifies to a higher value), while transistor 320 is turned off (i.e., amplifies to a lower value). Likewise, in this example, transistor 340 is turned on and transistor 330 is turned off. The voltage signal at input transistor 310 is provided to load transistor 350 and then to intermediary transistor 357. These transistors serve to further amplify the voltage signal. Load transistor 380 receives voltage signals from intermediary transistor 357 and input transistor 340, amplifies these signals and supplies a further amplified signal to output transistor 390. As $\delta_{input}$ becomes negative and $-\delta_{input}$ becomes positive, input transistors 320 and 330 are turned on and input transistors 310 and 340 are turned off. The voltage signal from input transistor 320 is amplified into load transistor 360 and input to intermediary transistor 355. The resulting voltage signals from intermediary transistor 355 and input transistor 330 are supplied to load transistor 370, which amplifies these voltage signals and supplies a further amplified signal to output transistor 395. The circuit of FIG. 2, thus takes the voltage signals $\delta_{input}$ and $-67_{input}$ and provides a single output (labeled $\sigma_{output}$). The symmetrical design between the p-side and the n-side transistors naturally level shifts the output to midway between the supply voltages (e.g., the $V_{ss}$ and $V_{dd}$ supply voltages present in the input stage), thus inherently allowing optimum gain from the transistors.

Figure 3:
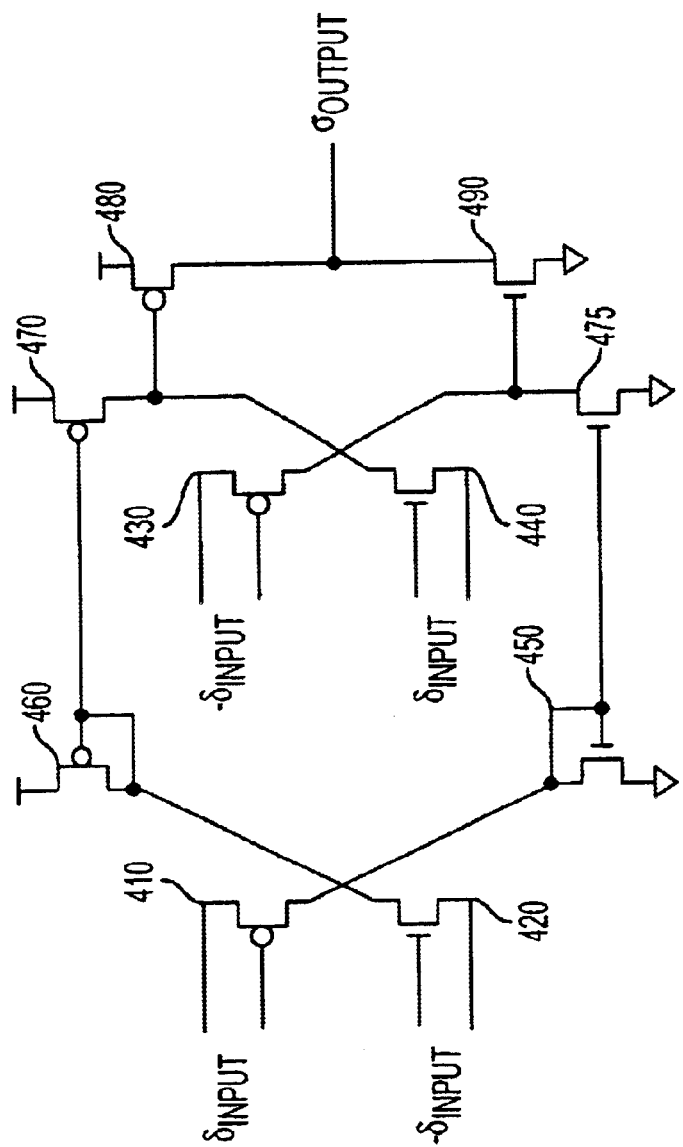
FIG. 3 is a circuit diagram of an output stage for a matched current differential amplifier according to an alternative embodiment of the present invention.

An alternative embodiment of the present invention is shown in FIG. 3. Again, input transistors 410, 420, 430, and 440 are provided to accept the input voltage signals $\delta_{input}$ and $-\delta_{input}$. The voltage signal provided by input transistor 410 is supplied to load transistor 450 and the voltage signal supplied by input transistor 420 is supplied to load transistor 460. Intermediary transistors 470 and 475 receive the voltage signals from input transistors 440 and 430, respectively. The intermediary transistors 470 and 475 serve as resistive loads instead of as amplifiers as in the embodiment of FIG. 2. The amplified voltage signals are provided to output transistors 480 and 490 and generates an output voltage signal $\sigma_{output}$.

Figure 4:
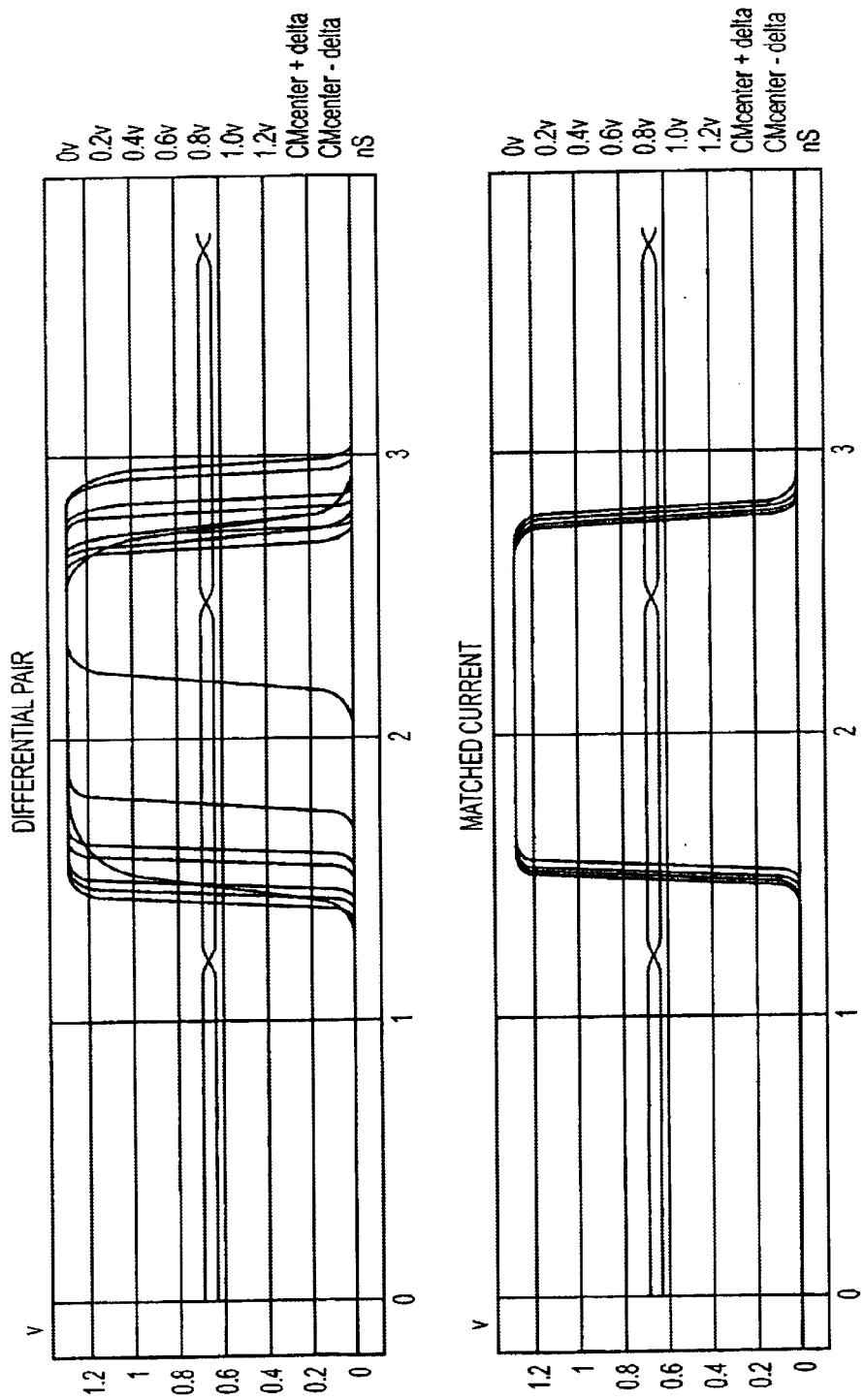
FIG. 4 is a graph showing the output characteristics for an output stage of the present invention.

Referring to FIG. 4, a comparison in operation between a traditional differential pair amplifier and a matched current differential amplifier is shown. As seen from these graphs a matched current differential amplifier with the output stages as described above provides superior performance compared to traditional differential pair amplifiers. In both graphs, a small-signal differential of 50 mV is shown switching in polarity from a center common mode voltage (the same differentials for other common mode voltages are not shown for the sake of clarity). In both graphs, the supply voltage is 1.3 volts as indicated by the Y-axis; the X-axis represents time in nanoseconds. In the top graph, the output signals for several common mode voltages are shown when the differential input switches polarity twice. As can be seen from the top graph, the traditional differential amplifier does not provide a uniform performance. As the common mode voltage increases past the center common mode value, the output signal becomes delayed, and breaks down at higher common modes. In the lower graph, the same differential input signals are provided with a similar 1.3 volt supply voltage. As can be seen from the lower graph, a more ideal behavior of the matched current differential amplifier and output stage is seen. There is negligible delay in the response of the amplifier to differential changes over the entire range of common mode voltages.

Figure 5:
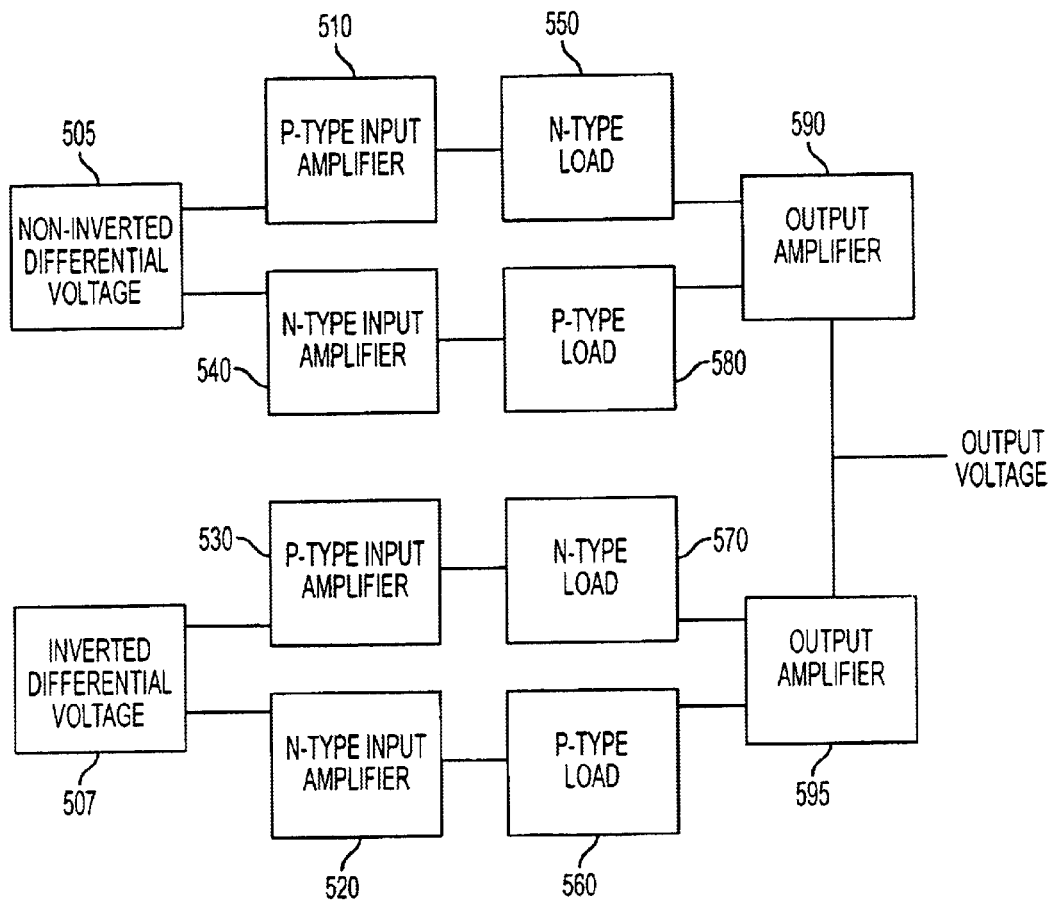
FIG. 5 is a general block diagram of an embodiment of the present invention.

A general block diagram of the circuit of the present invention is shown in FIG. 5. In FIG. 5, a non-inverting differential 505 is suppled to a P-type input amplifier 510 (e.g., PMOS 310) and a N-type amplifier 540 (e.g., NMOS 540). An inverted differential voltage is supplied to a P-type input amplifier 530 and an N-type amplifier. The outputs of the N-type amplifiers 540 and 520 are supplied to P-type loads 580 and 560, respectively (e.g., PMOS 360). The outputs of the P-type amplifiers 510, 530 are supplied to N-type loads 550 and 570, respectively (e.g., NMOS 370). The outputs of loads 550 and 580 are supplied to a first output amplifier 590 and the outputs of loads 570 and 560 are supplied to output amplifier 595 (e.g., amplifier 395) to generate a single output voltage. As stated above, the balance of N and P-type amplifiers and loads provides a natural level shift of the output signal midway between the supply voltages, thus allowing optimum gain from the amplifiers.

Using the differential amplifier and output stage described above, improved performance may be seen in a variety of chip products that used differential amplifiers. Using embodiments of the present invention, "voltage walls" caused by the breakdown of the output signal at higher common mode voltages may be avoided. Also, "timing walls" due to variable delays in response at different common mode voltages may be avoided.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. An output stage for a differential amplifier comprising:
   first and second P-type input amplifiers to receive a non-inverted differential voltage signal and an inverted differential voltage, respectively;
   first and second N-type input amplifiers to receive the non-inverted differential voltage signal and the inverted differential voltage, respectively;
   a first output amplifier to receive the output of the first P-type input amplifier via an N-type load and the output of the first N-type amplifier via a P-type load; and
   a second output amplifier to receive the output of the second P-type input amplifier via an N-type load and the output of the second N-type amplifier via a P-type load, wherein an output voltage signal is to be provided between said first and second output amplifiers.

2. The output stage of claim 1 wherein said first output amplifier is a P-type amplifier and said second output amplifier is an N-type amplifier.

3. The output stage of claim 1 wherein said non-inverted differential voltage signal and said inverted differential voltage signal have matched currents.

4. An output stage for a differential amplifier comprising:
   first and second P-type transistors to receive a non-inverted differential voltage and an inverted differential voltage, respectively;
   first and second N-type transistors to receive the non-inverted differential voltage and the inverted differential voltage, respectively;
   a first output amplifier to receive the output of the first P-type transistor via a first N-type load and the output of the first N-type transistor via a first P-type load; and
   a second output amplifier to receive the output of the second P-type transistor via a second N-type load and the output of the second N-type transistor via second P-type load, wherein an output voltage is to be provided between said first and second output amplifiers.

5. The output stage of claim 4 wherein said first output amplifier is a P-type transistor and said second output amplifier is an N-type transistor.

6. The output stage of claim 4 wherein said non-inverted differential voltage signal and said inverted differential voltage signal have matched currents.

7. An output stage for a differential amplifier comprising:
   first and second P-type transistors to receive a non-inverted differential voltage and an inverted differential voltage, respectively;
   first and second N-type transistors to receive the non-inverted differential voltage and the inverted differential voltage, respectively;
   first and second N-type loads coupled to said first and second P-type transistors, respectively;
   first and second P-type loads coupled to said first and second N-type transistors, respectively;
   first and second intermediate transistors coupled to said first P-type transistor and said second N-type transistor, respectively;
   a first output amplifier to receive the output of the first intermediary transistor and the output of the second N-type transistor; and
   a second output amplifier to receive the output of the second intermediary transistor and the output of the second P-type transistor, wherein an output voltage is to be provided between said first and second output amplifiers.

8. The output stage of claim 7 wherein said first output amplifier is a P-type transistor and said second output amplifier is an N-type transistor.

9. The output stage of claim 8 wherein said first intermediate transistor is a N-type transistor and said second intermediate transistor is an P-type transistor.

10. The output stage of claim 7 wherein each of said transistors is a metal-oxide-semiconductor field effect transistor.

11. The output stage of claim 5 wherein said non-inverted differential voltage signal and said inverted differential voltage signal have matched currents.

12. The output stage of claim 9 wherein said non-inverted differential voltage signal and said inverted differential voltage signal have matched currents.

* * * * *